United States Patent
Moffatt

(10) Patent No.: US 8,405,175 B2
(45) Date of Patent: Mar. 26, 2013

(54) SUITABLY SHORT WAVELENGTH LIGHT FOR LASER ANNEALING OF SILICON IN DSA TYPE SYSTEMS

(75) Inventor: Stephen Moffatt, Jersey (GB)

(73) Assignee: Applied Materials, Inc., Santa Clara, CA (US)

( * ) Notice: Subject to any disclaimer, the term of this patent is extended or adjusted under 35 U.S.C. 154(b) by 27 days.

(21) Appl. No.: 13/096,888

(22) Filed: Apr. 28, 2011

(65) Prior Publication Data

US 2011/0204045 A1 Aug. 25, 2011

Related U.S. Application Data

(62) Division of application No. 12/142,108, filed on Jun. 19, 2008, now Pat. No. 7,947,584.

(60) Provisional application No. 61/050,138, filed on May 2, 2008.

(51) Int. Cl.
H01L 27/14 (2006.01)
H01L 31/00 (2006.01)

(52) U.S. Cl. ... 257/428; 257/432; 257/440; 257/E21.32; 257/E21.134; 257/E21.324; 257/E21.333; 257/E21.347

(58) Field of Classification Search .................. 257/161, 257/121, 428, 431, 432, 440, E21.32, E21.134, 257/E21.324, E21.333, E21.347
See application file for complete search history.

(56) References Cited

U.S. PATENT DOCUMENTS

| | | | |
|---|---|---|---|
| 6,987,240 B2 * | 1/2006 | Jennings et al. ........... 219/121.8 |
| 7,005,601 B2 | 2/2006 | Jennings | |
| 7,078,302 B2 | 7/2006 | Ma et al. | |
| 7,078,651 B2 | 7/2006 | Jennings | |
| 7,109,087 B2 | 9/2006 | Autryve et al. | |
| 7,109,098 B1 | 9/2006 | Ramaswamy et al. | |
| 7,129,440 B2 | 10/2006 | Adams et al. | |
| 7,135,392 B1 | 11/2006 | Adams et al. | |
| 7,262,106 B2 | 8/2007 | Autryve et al. | |
| 7,279,721 B2 | 10/2007 | Jennings et al. | |
| 7,872,209 B2 * | 1/2011 | Jennings et al. ........... 219/121.8 |
| 7,875,829 B2 * | 1/2011 | Jennings et al. ........... 219/121.8 |
| 7,947,584 B2 * | 5/2011 | Moffatt .................. 438/535 |
| 8,178,819 B2 * | 5/2012 | Jennings et al. ........... 219/121.8 |
| 2004/0063290 A1 | 4/2004 | Jennings et al. | |
| 2005/0218124 A1 | 10/2005 | Jennings et al. | |
| 2006/0102599 A1 | 5/2006 | Adams et al. | |
| 2006/0102607 A1 | 5/2006 | Adams et al. | |
| 2006/0158641 A1 | 7/2006 | Thomas et al. | |
| 2006/0234458 A1 | 10/2006 | Jennings et al. | |
| 2006/0260545 A1 | 11/2006 | Ramaswamy et al. | |
| 2006/0286763 A1 | 12/2006 | Ma et al. | |
| 2006/0292808 A1 | 12/2006 | Autryve et al. | |

(Continued)

FOREIGN PATENT DOCUMENTS

JP 2008-071788 A 3/2008

OTHER PUBLICATIONS

Search Report and Written Opinion for PCT/US2009/41137 dated Nov. 23, 2009.

Primary Examiner — David Nhu
(74) Attorney, Agent, or Firm — Patterson & Sheridan, LLP

(57) ABSTRACT

The present invention generally relates to a thermal processing apparatus and method that permits a user to index one or more preselected light sources capable of emitting one or more wavelengths to a collimator. Multiple light sources may permit a single apparatus to have the capability of emitting multiple, preselected wavelengths. The multiple light sources permit the user to utilize multiple wavelengths simultaneously to approximate "white light". One or more of a frequency, intensity, and time of exposure may be selected for the wavelength to be emitted. Thus, the capabilities of the apparatus and method are flexible to meet the needs of the user.

20 Claims, 4 Drawing Sheets

U.S. PATENT DOCUMENTS

| | | |
|---|---|---|
| 2007/0108166 A1 | 5/2007 | Jennings et al. |
| 2007/0114214 A1 | 5/2007 | Jennings et al. |
| 2007/0243721 A1 | 10/2007 | Autryve et al. |
| 2007/0293058 A1 | 12/2007 | Jennings et al. |
| 2008/0002253 A1 | 1/2008 | Jennings et al. |
| 2008/0013911 A1 | 1/2008 | Jennings |
| 2008/0045040 A1 | 2/2008 | Nakao |
| 2008/0108210 A1 | 5/2008 | Parihar et al. |
| 2008/0210671 A1 | 9/2008 | Jennings et al. |
| 2008/0214014 A1 | 9/2008 | Ranish et al. |
| 2008/0308534 A1 | 12/2008 | Li et al. |
| 2009/0032511 A1 | 2/2009 | Adams et al. |
| 2009/0046750 A1 | 2/2009 | Li et al. |

* cited by examiner

SUITABLY SHORT WAVELENGTH LIGHT FOR LASER ANNEALING OF SILICON IN DSA TYPE SYSTEMS

CROSS-REFERENCE TO RELATED APPLICATIONS

This application is a divisional application of U.S. patent application Ser. No. 12/142,108, filed Jun. 19, 2008, issued as U.S. Pat. No. 7,947,584, which claims benefit of U.S. provisional patent application Ser. No. 61/050,138 (APPM/011935L), filed May 2, 2008, and both applications are herein incorporated By reference in their entirety.

BACKGROUND OF THE INVENTION

1. Field of the Invention

Embodiments of the present invention generally relate to a thermal processing apparatus and method.

2. Description of the Related Art

The integrated circuit (IC) market is continually demanding greater memory capacity, faster switching speeds, and smaller feature sizes. One of the major steps the industry has taken to address these demands is to change from batch processing silicon substrates in large furnaces to single substrate processing in a small chamber.

During single substrate processing, the substrate may be heated to a high temperature to allow various chemical and physical reactions to take place in multiple IC devices defined in portions of the substrate. Of particular interest, favorable electrical performance of the IC devices may require implanted regions to be annealed. Annealing recreates a crystalline structure from regions of the substrate that were previously made amorphous, and activates dopants by incorporating their atoms into the crystalline lattice of the substrate. Thermal processes such as annealing may require providing a relatively large amount of thermal energy to the substrate in a short amount of time, and then rapidly cooling the substrate to terminate the thermal process.

Dynamic surface annealing (DSA) techniques have been developed to anneal finite regions on the surface of the substrate to provide well-defined annealed and/or re-melted regions on the surface of the substrate. Generally, during such processes, various regions on the surface of the substrate are sequentially exposed to a desired amount of energy delivered from a light source to cause the preferential heating of desired regions of the substrate. These techniques are preferred over conventional processes that sweep the light source energy across the surface of the substrate because the overlap between adjacent scanned regions is strictly limited to the unused space between die, or "kurf," lines, resulting in more uniform annealing across the desired regions of the substrate.

DSA techniques may utilize a single light source, such as a red laser having a wavelength of about 810 nm, and anneal the desired areas of the substrate. The red laser does not cover the entire spectrum of wavelengths and therefore may not achieve optimum annealing. Therefore, there is a need in the art for a DSA apparatus and method that can effectively anneal a substrate utilizing a greater portion of the spectrum of wavelengths.

SUMMARY OF THE INVENTION

The present invention generally relates to a thermal processing apparatus and method that permits a user to index one or more preselected light sources capable of emitting one or more wavelengths to a collimator. Multiple light sources may permit a single apparatus to have the capability of emitting multiple, preselected wavelengths. The multiple light sources permit the user to utilize multiple wavelengths simultaneously to approximate "white light". One or more of a frequency, intensity, and time of exposure may be selected for the wavelength to be emitted. Thus, the capabilities of the apparatus and method are flexible to meet the needs of the user.

In one embodiment, a thermal processing method is disclosed. The method comprises disposing a substrate into a processing chamber and selecting a plurality of different first electromagnetic radiation wavelengths for thermally processing the substrate. The method may also comprise diffracting the electromagnetic radiation and indexing a plurality of light sources corresponding to the selected plurality of different first electromagnetic radiation wavelengths to one or more collimators. The method may also comprise focusing continuous wave electromagnetic radiation into a line of radiation extending at least partially across an upper surface of the substrate to thermally process a first portion of the substrate.

In another embodiment, a thermal processing method is disclosed. The method comprises disposing a source of electromagnetic radiation in a processing chamber. The source may have a plurality of light sources with at least one light source of the plurality of light sources capable of emitting a different wavelength than another light source of the plurality of light sources. The method may also comprise selecting one or more first electromagnetic radiation wavelengths for thermally processing a substrate and selecting one or more of a frequency, an intensity, and a time of exposure for at least one of the one or more first electromagnetic radiation wavelengths. The method may also comprise linearly focusing the electromagnetic radiation from the source onto a first portion of the substrate at the selected frequency, intensity, and/or time of exposure and translating the electromagnetic radiation across the substrate.

In another embodiment, a thermal flux processing device is disclosed. The device comprises a continuous wave electromagnetic radiation source. The source may comprise a plurality of light sources with at least one light source of the plurality of light sources capable of emitting electromagnetic radiation at a wavelength different from a second light source of the plurality of light sources. The device may also comprise a stage configured to receive a substrate thereon and refractive optics disposed between the continuous wave electromagnetic radiation source and the stage. The optics may be configured to focus continuous wave electromagnetic radiation from the continuous wave electromagnetic radiation source into a line of continuous wave electromagnetic radiation on an upper surface of the substrate. The device may also comprise a translation mechanism configured to translate the continuous wave electromagnetic radiation source relative to the stage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a thermal processing apparatus and method that permits a user to index one or more preselected light sources capable of emitting one or more wavelengths to a collimator. Multiple light sources may permit a single apparatus to have the capability of emitting multiple, preselected wavelengths. The multiple light sources permit the user to utilize multiple wavelengths simultaneously to approximate "white light". One or more of a frequency, intensity, and time of exposure may be selected for the wavelength to be emitted. Thus, the capabilities of the apparatus and method are flexible to meet the needs of the user.

Figure 1:
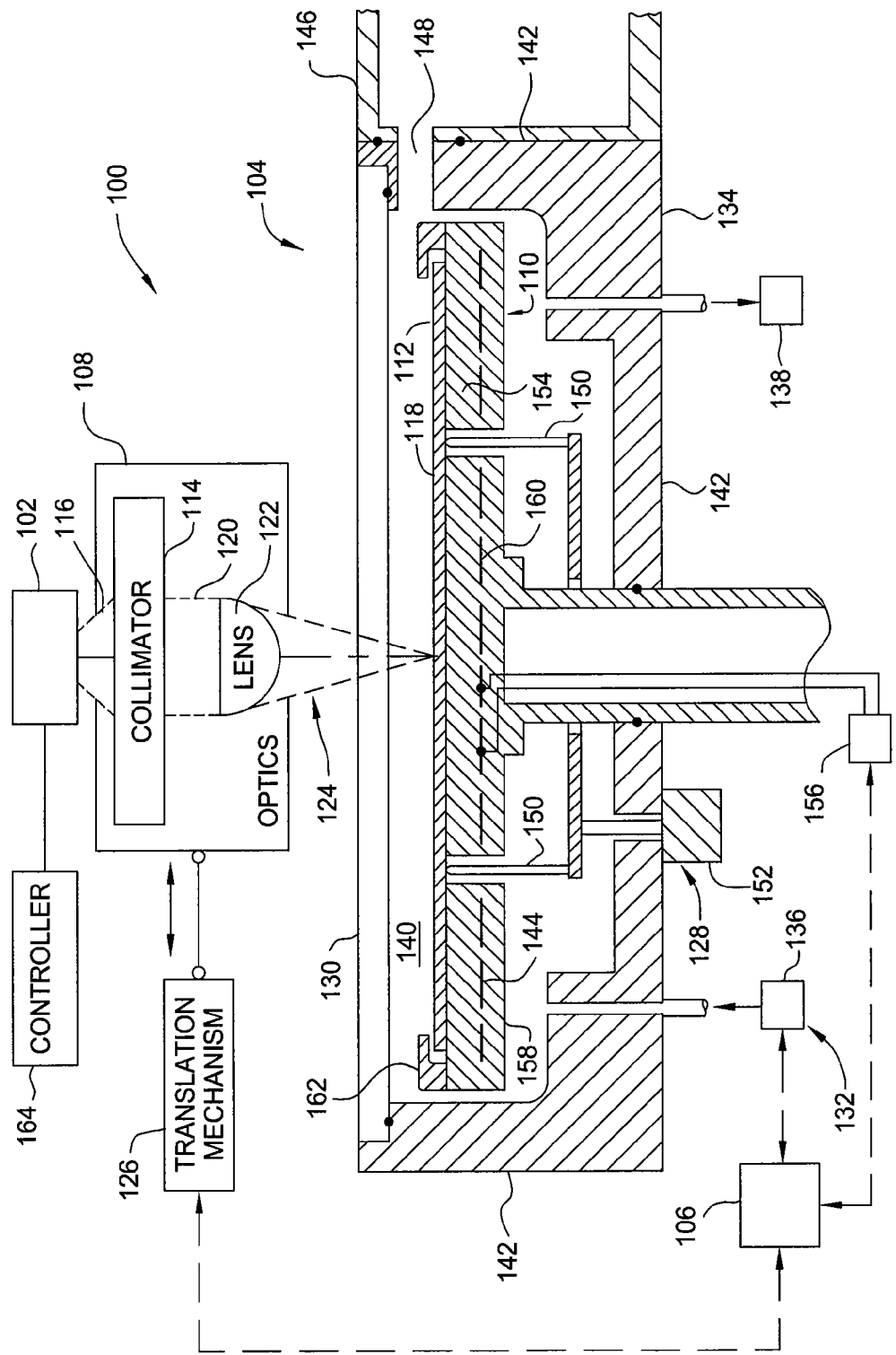
FIG. 1 is a cross-sectional view of a thermal processing apparatus 100 according to one embodiment of the invention.

FIG. 1 is a cross-sectional view of an apparatus 100 for thermally processing a semiconductor substrate, according to an embodiment of the invention. The apparatus 100 comprises an electromagnetic radiation source 102, a processing chamber 104, system controller 106, and optics 108 disposed between the electromagnetic radiation source 102 and the substrate support 110. In one embodiment, the substrate 112 is a substrate that has a high thermal conductivity, such as a single crystal silicon substrate, silicon on insulator (SOI), silicon germanium or alloys thereof, or the like.

In one embodiment, the electromagnetic radiation source 102 is capable of emitting continuous waves or rays of electromagnetic radiation, such as light. By continuous wave it is meant that the radiation source is capable of emitting radiation continuously, i.e., not a burst, pulse, or flash of light. In one embodiment, the electromagnetic radiation source 102 is capable of emitting radiation continuously for at least 15 seconds. In another embodiment, the electromagnetic radiation source 102 is adapted to deliver electromagnetic energy that is used to perform a pulse laser anneal process. Typical sources of electromagnetic energy include, but are not limited to an optical radiation source, an electron beam source, a microwave energy source, and a laser diode.

The optics 108 preferably comprise one or more collimators 114 to collimate radiation 116 from the electromagnetic radiation source 102 in a direction perpendicular to the upper surface 118 of the substrate 112. This collimated radiation 120 is then focused by at least one lens 122 into a line of radiation 124 at an upper surface 118 of the substrate 112. Lens 122 is any suitable lens, or series of lenses, capable of focusing radiation into a desired shape, such as a line. The lens 122 may be a cylindrical lens, one or more concave lenses, convex lenses, plane mirrors, concave mirrors, convex mirrors, refractive lenses, diffractive lenses, Fresnel lenses, gradient index lenses, or the like.

The apparatus 100 also comprises a translation mechanism 126 configured to translate the line of radiation 124 and the substrate support 110 relative to one another. In one embodiment, the translation mechanism 126 is coupled to the electromagnetic radiation source 102 and/or the optics 108 to move the electromagnetic radiation source 102 and/or the optics 108 relative to the substrate support 110. In another embodiment, the translation mechanism 126 is coupled to the substrate support 110 to move the substrate support 110 relative to the electromagnetic radiation source 102 and/or the optics 108. In yet another embodiment, the translation mechanism 126 moves the electromagnetic radiation source 102 and/or the optics 108, and the substrate support 110. Any suitable translation mechanism may be used, such as a conveyor system, rack and pinion system, mechanical actuator, or the like.

The translation mechanism 126 is preferably coupled to a system controller 106 to control the scan speed at which the substrate support 110 and the line of radiation 124 move relative to one another. In addition, the translation of the substrate support 110 and the line of radiation 124 relative to one another may be along a path perpendicular to the line of radiation 124 and parallel to the upper surface 118 of the substrate 112. In another embodiment, the translation mechanism 126 moves at a constant speed. In one embodiment, this constant speed is approximately 2 cm/s for a 35 micron wide line. In another embodiment, the translation of the substrate support 110 and the line of radiation 124 relative to one another is not along a path perpendicular to the line of radiation 124.

The processing chamber 104 generally contains a substrate support 110 configured to receive a substrate 112 thereon, a lift assembly 128, a transparent window 130, gas delivery system 132, and a chamber 134. The transparent window 130 may comprise quartz, sapphire or other optically transparent material that allows the energy delivered from the electromagnetic radiation source 102 to pass therethrough and heat the upper surface 118 of the substrate 112 without significant energy loss.

The gas delivery system 132 generally contains a gas source 136 and an exhaust system 138 that are in fluid communication with the processing region 140 that is enclosed by the walls 142 of the chamber 134 and the transparent window 130. The gas source 136 is generally adapted to provide a flow of a gas, such as an inert gas (e.g., argon, nitrogen) into the processing region 140 to prevent the oxidation of the substrate surface 118 when it is heated by the energy delivered from the electromagnetic radiation source 102 or heated by the heating elements 144. The exhaust system 138 is generally adapted to remove the injected gas delivered from the gas source, remove any volatile contaminants generated during thermal processing, and/or evacuate the processing region 140 to a pressure below atmospheric pressure by use of conventional mechanical rough pump, roots blower, or other similar fluid removal device. In one embodiment, the exhaust system 138 is adapted to evacuate the processing region 140 to a pressure less than about 300 Torr.

The chamber 134 may be constructed of materials that can maintain a chamber pressure below atmospheric pressure, such as about 300 Torr, and a substrate deposition temperature between about 450 degrees Celsius and about 800 degrees Celsius. In one embodiment, the chamber 134 can be made from a metal, such as aluminum or stainless steel that is water cooled. In one embodiment, the chamber 134 is coupled to transfer chamber 146 of a conventional cluster tool that contains a robot (not shown) that is adapted to transfer a substrate to and from the processing region 140 of the processing chamber 104 through an access port 148. In one configuration, the transfer chamber 146 may be isolated from the processing region 140 of the processing chamber 104 by use of a conventional slit valve (not shown), or gate valve, to prevent contaminants from passing in either direction through the access port 148.

The lift assembly 128 generally contains a plurality of lift pins 150 and an actuator 152 (e.g., air cylinder, DC servo motor and lead screw) that are adapted to move relative to the substrate support 110 so that a substrate 112 can be transferred to and from the substrate support 110, and to and from a substrate transferring device, such as a robot. As shown in FIG. 1, the lift pins 150 are in the "down" position so that the substrate 112 can be positioned on the substrate supporting surface 154 of the substrate support 110.

The substrate support 110 may comprise a platform capable of supporting the substrate 112, as explained below. In one embodiment, the substrate support 110 includes a means for grasping the substrate, such as a frictional, gravitational, mechanical, or electrical system. Examples of suitable means for grasping include mechanical clamps, electrostatic chuck, vacuum chuck, or the like. In one embodiment, the substrate support 110 contains a heating element 144 that is in electrical communication with temperature control assembly 156 and is in thermal contact with a substrate 112 when it is disposed on the substrate support 110. The heating element 144 can be a resistive heating element that is embedded within the support 158 of the substrate support 110. In one embodiment, the temperature control assembly 156 is adapted to supply power to the heating element 144 so that the substrate 112 may be heated to an elevated temperature, such as between about 450 degrees Celsius and about 800 degrees Celsius. The temperature control assembly 156 generally contains a power source (not shown) and a temperature measurement device (not shown) that are adapted to control and monitor the temperature of the substrate support 110 using conventional means.

The substrate support 110 generally contains a support 158, a fluid delivery system, and a temperature control assembly 156 that are in communication with the system controller 106. In one embodiment, the substrate 112 can be supported on the fluid delivered from a fluid delivery system to ports formed in the substrate supporting surface 154 of the support 158. During one or more steps during thermal processing, a substrate 112 can be supported on a cushion of gas above the substrate supporting surface 154 due to the fluid delivered through plenum 160 to the ports, so that a gap can be formed. The gap created by the fluid may be between about 1 μm and about 1000 μm. In one embodiment, the support 158 may be formed from a metal, ceramic, plastic, semiconductor or other material used to support substrates during processing. In one embodiment, the support 158 is made of a ceramic material, such as quartz, sapphire, silicon carbide, alumina, zirconia, aluminum nitride, or boron nitride.

The fluid delivery system, generally contains one or more fluid control components that are used to provide and control the delivery of fluid to the ports formed in the support 154. The fluid controlling devices are adapted to control the flow, velocity and/or pressure of the fluid delivered to the ports by use of commands sent from the system controller 106. The fluid controlling devices can be conventional mass flow controllers (MFCs) that are in communication with the system controller 106, or a fixed orifice that is configured to deliver desired flow at a known pressure. The control of the substrate movement can also be affected by the type of fluids (e.g., gasses) delivered by the one or more ports, and thus the viscosity, atomic mass, pressure, and density need to be taken into account. The selection of the fluid generally must also take into account its affect on the process performed in the processing region 140.

In one embodiment, a shadow ring 162 may be disposed over a portion of the substrate support 110 and a substrate 112 when it is positioned on the substrate supporting surface 154, as shown in FIG. 1. The shadow ring 162 is generally designed to shadow the edge of the substrate 112 to reduce any thermal uniformity edge effects and prevent substrate 112 breakage as the line of radiation 124 is swept across the surface of the substrate 112. The shadow ring 162 may be positioned relative to the substrate 112 and/or substrate supporting surface 154 by use of a shadow ring lift assembly (not shown) to allow the substrate to be transferred between the substrate supporting surface 154 and a robot (not shown) without interfering with the shadow ring 162. The shadow ring 162 may be made of material that has a desired thermal mass, a desirable emissivity and absorption coefficient, and is able to withstand the energy delivered by the electromagnetic radiation source 102.

The electromagnetic radiation source 102 may comprise a plurality of electromagnetic radiation sources 102 and be controlled by a controller 164. The electromagnetic radiation source 102 may comprise a plurality of light sources that permit a user to select one or more light sources for radiating the substrate 112. In one embodiment, a single light source may be selected. In another embodiment, multiple light sources may be selected. In another embodiment, multiple light sources capable of emitting substantially the same wavelength may be selected. In another embodiment, multiple light sources capable of emitting different wavelengths may be selected.

The individual light sources may be indexed to the collimator 114 to individually radiate a predetermined wavelength. A user preselects a desired wavelengths for exposing the substrate 112. The controller 164 then selectively indexes the particular light source to the collimator 114. In one embodiment, the light source may be capable of emitting a wavelength in the visible range. In another embodiment, the light source may be capable of emitting a wavelength in the ultraviolet range. In another embodiment, the light source may be capable of emitting a wavelength in the near ultraviolet range. In another embodiment, the light source may be capable of emitting a wavelength in the deep ultraviolet range. In another embodiment, the light source may be capable of emitting a wavelength in the infrared range. In another embodiment, the light source may be capable of emitting a wavelength in the near infrared range. In another embodiment, the light source may be capable of emitting a wavelength in the deep infrared range.

In one embodiment, a user may preselect a plurality of wavelengths for exposing the substrate 112. The controller 164 then indexes the plurality of light sources to the collimator 114. In one embodiment, light sources may be capable of emitting one or more wavelengths in a range selected from the group consisting of the visible range, the ultraviolet range, the near ultraviolet range, the deep ultraviolet range, the infrared range, near infrared range, the deep infrared range, and combinations thereof.

The user may preselect the intensity of the electromagnetic radiation, frequency of the electromagnetic radiation, and time of exposure of the electromagnetic radiation. Additionally, the user may adjust the intensity, frequency, and time of exposure to suit the needs of the process. The adjusting may occur between exposures or during exposures. The adjusting may occur based upon real time feedback from metrology results.

The optics 108 may diffract and/or reflect the selected wavelength or wavelengths passing therethrough such that the light emitting in a line of radiation 124 has a wavelength that is less than a critical dimension of the substrate. In one embodiment, the light emitted in a line of radiation 124 has a wavelength that is about one fourth of the wavelength originally emitted by the electromagnetic radiation source 102. When a plurality of wavelengths are emitted from the electromagnetic radiation source 102, the average wavelength, after diffraction and/or reflection, may be less than or equal to the critical dimension of the substrate. The critical dimension may be about 65 nm or less. In one embodiment, the critical dimension may be about 45 nm or less. In one embodiment, the electromagnetic radiation source 102 may emit light having a wavelength between about 150 nm and about 200 nm, and the average wavelength after diffraction and/or reflection may be less than or equal to the critical dimension of the substrate. In one embodiment, the wavelength after diffraction and/or reflection may be less than about two thirds of the critical dimension. By selecting a wavelength that, after diffraction and/or reflection, is less than the critical dimension, precise control of the substrate exposure may occur.

In one embodiment, the light source may comprise a laser diode. In another embodiment, the plurality of light sources may comprise one or more laser diodes. Thus, a plurality of laser diodes may be utilized. The laser diodes may emit light at the same wavelength or at different wavelengths. In one embodiment, the laser diodes may comprise a red laser diode emitting light having a wavelength between about 630 nm to about 700 nm, an orange laser diode emitting light having a wavelength between about 590 nm and about 630 nm, a yellow laser diode emitting a light having a wavelength between about 560 nm and about 590 nm, a violet laser emitting a light having a wavelength between about 400 to about 450 nm, a blue laser diode emitting a light having a wavelength between about 450 nm and about 490 nm, and a green laser diode emitting a light having a wavelength between about 490 nm to about 560 nm. In one embodiment, the electromagnetic radiation source 102 is adapted to deliver energy at a wavelength less than about 1064 nm to a primarily silicon containing substrate. In one aspect of the invention it may be desirable to use an Nd:YAG (neodymium-doped yttrium aluminum garnet) laser that is adapted to deliver energy at a wavelength between about 266 nm and about 1064 nm. In one embodiment, the power of the laser diodes may be in the range of 0.5 kW to 50 kW. Suitable laser diodes are made by Spectra-Physics of California, or by Cutting Edge Optronics, Inc. of St. Charles Mo.

Figure 2:
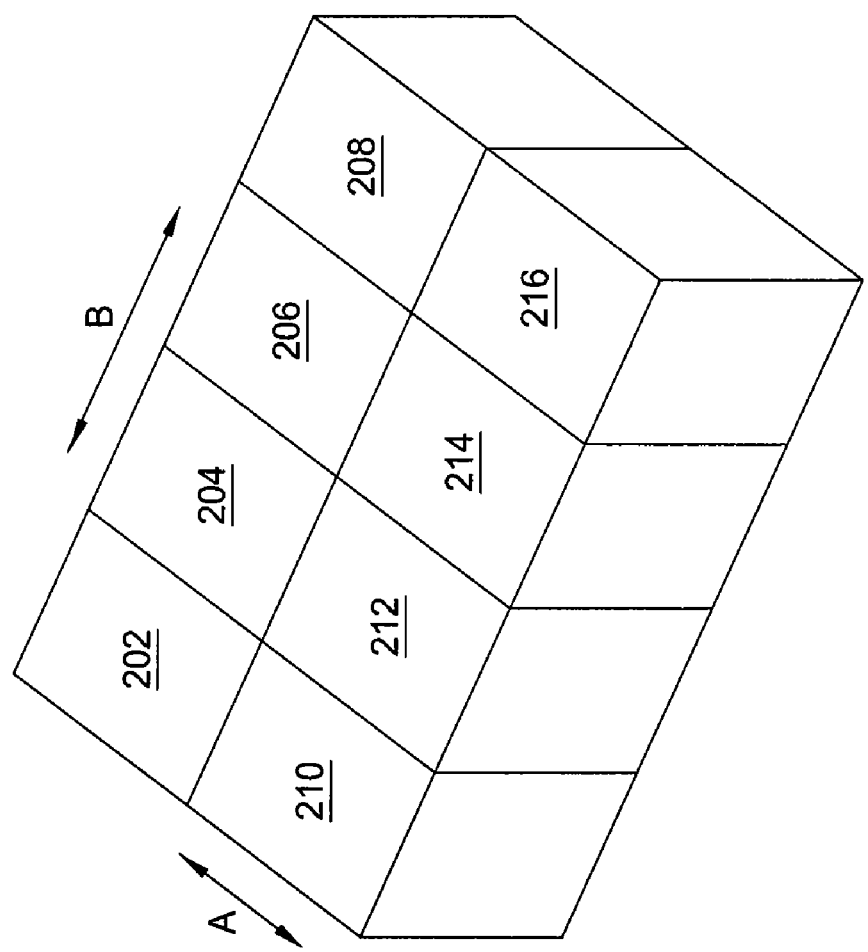
FIG. 2 is a schematic isometric view of an electromagnetic radiation source 200 according to one embodiment of the invention.

FIG. 2 is a schematic isometric view of an electromagnetic radiation source 200 according to one embodiment of the invention. The source 200 comprises a plurality of light sources 202, 204, 206, 208, 210, 212, 214, 216 that each may be selectively indexed to the collimator for individual selection. The electromagnetic radiation source 200 may be moved in two separate planes as shown by arrows "A" and "B" to index the light sources 202, 204, 206, 208, 210, 212, 214, 216 to a collimator. The intensity, frequency, and time of exposure for the electromagnetic radiation emitted from the light sources 202, 204, 206, 208, 210, 212, 214, 216 may be preselected by a user. In one embodiment, the intensity, frequency, and time of exposure for the electromagnetic radiation emitted from the light sources 202, 204, 206, 208, 210, 212, 214, 216 may be adjusted by a user. The adjusting may occur before exposure of the substrate, between exposure of the substrate, and/or during exposure of the substrate.

In one embodiment, a plurality light sources 202, 204, 206, 208, 210, 212, 214, 216 may be utilized simultaneously. In another embodiment, different light sources 202, 204, 206, 208, 210, 212, 214, 216 may be utilized in sequence. In another embodiment, all of the light sources 202, 204, 206, 208, 210, 212, 214, 216 may be utilized simultaneously. The light sources 202, 204, 206, 208, 210, 212, 214, 216 may collectively emit wavelengths in a range selected from the group consisting of the visible range, the ultraviolet range, the near ultraviolet range, the deep ultraviolet range, the infrared range, near infrared range, the deep infrared range, and combinations thereof. The light sources 202, 204, 206, 208, 210, 212, 214, 216 may be selectively and/or collectively and/or sequentially applied to radiate all colors of the visible spectrum to the substrate. Thus, the light sources 202, 204, 206, 208, 210, 212, 214, 216 may be selected such that the substrate is exposed to "white light" or an approximation of "white light". "White light" is a blend of at least two different wavelengths of light in the visible spectrum. For example, a light source that emits light at a wavelength in the blue spectrum may emit a light that is mixed with a light from the yellow spectrum to produce a light that appears white to the naked eye. In another example, a light source that emits a light at a wavelength in the blue spectrum may be mixed with a wavelength in the red spectrum and a wavelength in the green spectrum to produce a light that appears white to the naked eye. In another example, all of the wavelengths of the visible spectrum may be emitted together to produce a light that appears white.

In one embodiment, at least one of the light sources 202, 204, 206, 208, 210, 212, 214, 216 is capable of emitting electromagnetic radiation at a wavelength that, after diffraction and/or reflection, is less than the critical dimension of a feature formed on a substrate to be exposed. In another embodiment, at least one of the light sources 202, 204, 206, 208, 210, 212, 214, 216 is capable of emitting electromagnetic radiation at a wavelength that, after reflection and/or diffraction, is less than two-thirds of the critical dimension of a feature formed on a substrate to be exposed. In one embodiment, a light source may emit a radiation with a wavelength in the infrared spectrum, simultaneous with a light source that emits radiation with a wavelength in the visible spectrum, simultaneous with a light source that emits radiation with a wavelength in the infrared spectrum. The proportions of the multiple wavelengths may be varied to balance out pattern effects.

Figure 3:
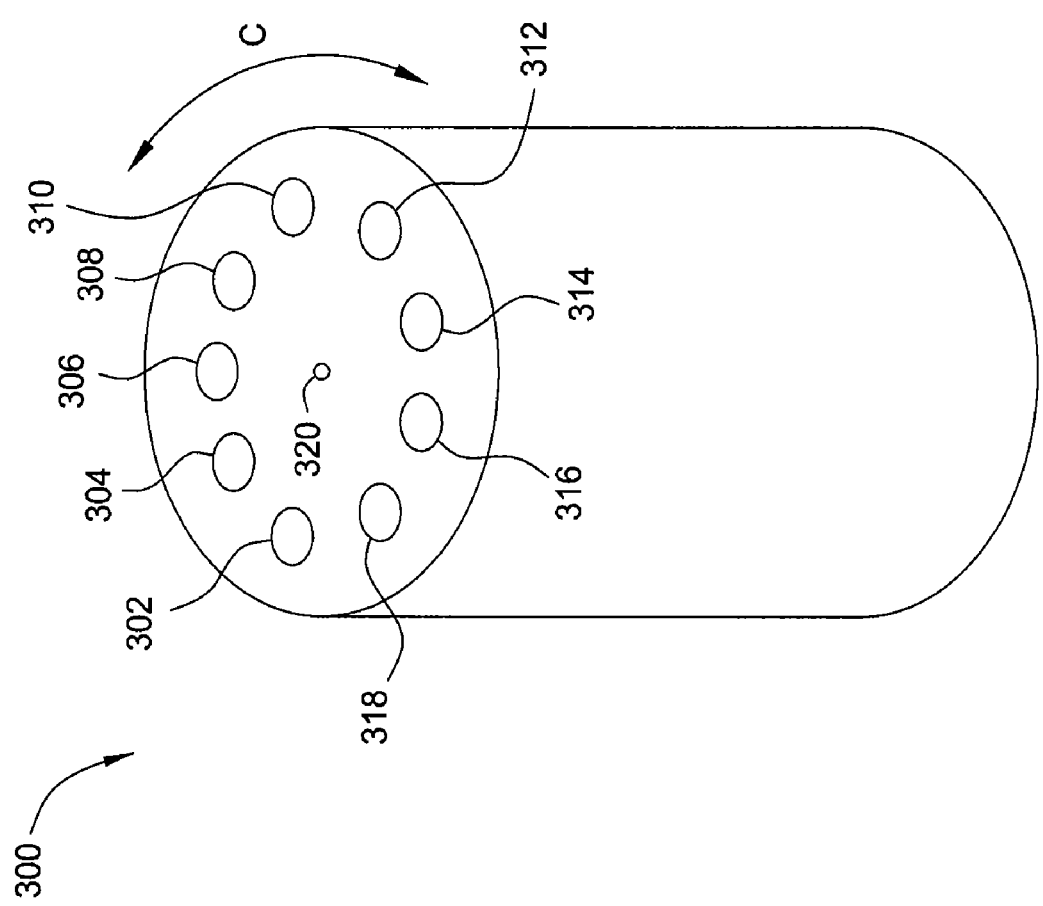
FIG. 3 is a schematic isometric view of an electromagnetic radiation source 300 according to another embodiment of the invention.

FIG. 3 is a schematic isometric view of an electromagnetic radiation source 300 according to another embodiment of the invention. The source 300 comprises a plurality of light sources 302, 304, 306, 308, 310, 312, 314, 316, 318 that each may be selectively indexed to the collimator for individual selection. The electromagnetic radiation source 300 may be rotated about an axis 320 as shown by arrows "C" to index the individual light sources 302, 304, 306, 308, 310, 312, 314, 316, 318 to a collimator. The intensity, frequency, and time of exposure for the electromagnetic radiation emitted from the light sources 302, 304, 306, 308, 310, 312, 314, 316, 318 may be preselected by a user. In one embodiment, the intensity, frequency, and time of exposure for the electromagnetic radiation emitted from the light sources 302, 304, 306, 308, 310, 312, 314, 316, 318 may be adjusted by a user. The adjusting may occur before exposure of the substrate, between exposure of the substrate, and/or during exposure of the substrate.

In one embodiment, a plurality light sources 302, 304, 306, 308, 310, 312, 314, 316, 318 may be utilized simultaneously. In another embodiment, different light sources 302, 304, 306, 308, 310, 312, 314, 316, 318 may be utilized in sequence. In another embodiment, all of the light sources 302, 304, 306, 308, 310, 312, 314, 316, 318 may be utilized simultaneously. The light sources 302, 304, 306, 308, 310, 312, 314, 316, 318 may collectively emit wavelengths in a range selected from the group consisting of the visible range, the ultraviolet range, the near ultraviolet range, the deep ultraviolet range, the infrared range, near infrared range, the deep infrared range, and combinations thereof. The light sources 302, 304, 306, 308, 310, 312, 314, 316, 318 may be selectively and/or collectively and/or sequentially applied to radiate all colors of the visible spectrum to the substrate. Thus, the light sources 302, 304, 306, 308, 310, 312, 314, 316, 318 may be selected such that the substrate is exposed to "white light" or an approximation of "white light". In one embodiment, at least one of the light sources 302, 304, 306, 308, 310, 312, 314, 316, 318 is capable of emitting electromagnetic radiation at a wavelength that, after diffraction and/or reflection, is less than the critical dimension of a feature formed on a substrate to be exposed. In another embodiment, at least one of the light sources 302, 304, 306, 308, 310, 312, 314, 316, 318 is capable of emitting electromagnetic radiation at a wavelength that, after diffraction and/or reflection, is less than two-thirds of the critical dimension of a feature formed on a substrate to be exposed.

Figure 4:
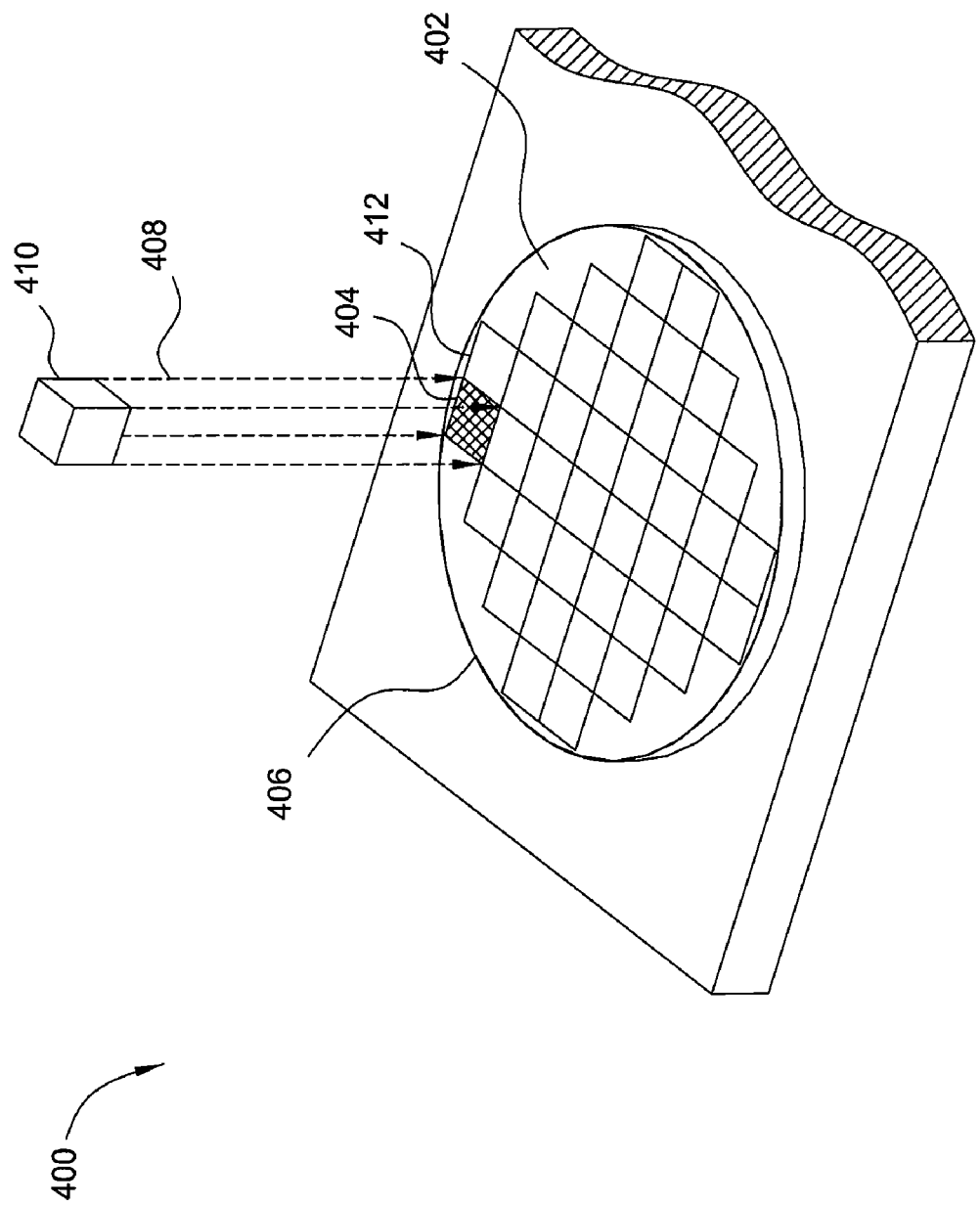
FIG. 4 is a schematic view of a thermal processing apparatus 400 performing a thermal treatment method according to one embodiment of the invention.

FIG. 4 is a schematic view of a thermal processing apparatus 400 performing a thermal treatment method according to one embodiment of the invention. A portion 404 of substrate 402 near its edge 406 is annealed. The electromagnetic energy 408 radiating from source 410 heats portion 404, while edge portion 412 remains unheated. In operation, the user preselects one or more wavelengths with which to expose the substrate. A controller then indexes one or more light sources within the source 410 to the substrate 402 and exposes the substrate 402 to the electromagnetic radiation from the source 410.

When the user preselects the one or more wavelengths, the wavelengths may, comprise a wavelength in the visible spectrum. In one embodiment, the wavelengths may comprise the entire visible spectrum, thus producing "white light". In another embodiment, one or more of the wavelengths may be from the ultraviolet range, the near ultraviolet range, the deep ultraviolet range, the infrared range, near infrared range, the deep infrared range, and combinations thereof. In one embodiment, the wavelengths may be greater than 840 nm. In another embodiment, the wavelengths may be less than 800 nm.

During the exposure, the user may adjust the time of the exposure, the frequency of the exposure, and/or the intensity of the exposure. The user may sequentially expose the same portion of the substrate 402 to multiple different wavelengths. The substrate 402 may have features having critical dimensions. Thus, the user may select the wavelength such that after diffraction and/or reflection, is less than the critical dimensions. In one embodiment, the wavelength may be less than about two thirds of the critical dimension.

By providing light sources of a plurality of different wavelengths on a thermal processing apparatus, a user may select one or more desired wavelength for exposure of a substrate. Thus, a single apparatus may be scalable to meet the individual needs of the user for dynamic surface annealing.

While the foregoing is directed to embodiments of the present invention, other and further embodiments of the invention may be devised without departing from the basic scope thereof, and the scope thereof is determined by the claims that follow.

The invention claimed is:

1. A thermal flux processing device, comprising:
a continuous wave electromagnetic radiation source comprising a plurality of light sources, wherein at least one light source of the plurality of light sources emits electromagnetic radiation at a wavelength different from a second light source of the plurality of light sources;
a stage positioned to receive a substrate thereon;
refractive optics disposed between the continuous wave electromagnetic radiation source and the stage, wherein the refractive optics focuses continuous wave electromagnetic radiation from the continuous wave electromagnetic radiation source into a line of continuous wave electromagnetic radiation on an upper surface of the substrate; and
a translation mechanism positioned to translate the continuous wave electromagnetic radiation source relative to the stage.

2. The thermal flux processing device of claim 1, further comprising a controller programmed to selectively emit electromagnetic radiation from one or more of the light sources.

3. The thermal flux processing device of claim 2, wherein the controller is programmed to selectively emit electromagnetic radiation from a plurality of light sources simultaneously having different wavelengths.

4. The thermal flux processing device of claim 1, wherein the multiple light sources collectively emit radiation encompassing the entire spectrum of visible light.

5. The thermal flux processing device of claim 1, wherein the multiple light sources comprise at least one light source that emits red light, at least one light source that emits orange light, at least one light source that emits yellow light, at least one light source that emits green light, at least one light source that emits blue light, and at least one light source that emits violet light.

6. The thermal flux processing device of 5, wherein the multiple light sources comprise at least one light source that emits near ultraviolet light or at least one light source that emits infrared light.

7. The thermal flux processing device of claim 1, further comprising a controller programmed to control one or more of an intensity, a time of exposure, and a frequency of the electromagnetic radiation.

8. The thermal flux processing device of claim 1, wherein the plurality of light sources are arranged in an array.

9. The thermal flux processing device of claim 8, further comprising:
an indexing mechanism, wherein the plurality of light sources are arranged in a circular array, and wherein the indexing mechanism is positioned to rotate the circular array of light sources.

10. The thermal flux processing device of claim 8, further comprising:
an indexing mechanism, wherein the plurality of light sources are arranged in a rectangular array, and wherein the indexing mechanism is positioned to linearly translate the rectangular array of light sources.

11. The thermal flux processing device of claim 1, wherein the translation mechanism is positioned to translate at least one of the continuous wave electromagnetic radiation source and the stage relative to the other.

12. The thermal flux processing device of claim 1, wherein the refractive optics comprises:
at least one collimator; and
at least one lens.

13. A thermal flux processing system, comprising:
a processing chamber;
a continuous wave electromagnetic radiation source positioned outside of the processing chamber and comprising a plurality of light sources, wherein at least one light source of the plurality of light sources emits electromagnetic radiation at a wavelength different from a second light source of the plurality of light sources;

a stage positioned within the processing chamber to receive a substrate thereon;

refractive optics disposed between the continuous wave electromagnetic radiation source and the stage, the refractive optics positioned to focus continuous wave electromagnetic radiation from the continuous wave electromagnetic radiation source into a line of continuous wave electromagnetic radiation on an upper surface of the substrate; and a translation mechanism positioned to translate the continuous wave electromagnetic radiation source relative to the stage.

14. The thermal flux processing system of claim 13, wherein the processing chamber comprises:

a chamber comprising aluminum or stainless steel; and a window coupled to the chamber, wherein the window is positioned between the stage and the continuous wave electromagnetic radiation source.

15. The thermal flux processing system of claim 14, wherein the window comprises quartz or sapphire.

16. The thermal flux processing system of claim 14, wherein the processing chamber further comprises:

a lift assembly coupled to the stage; and a heating element disposed within the stage.

17. The thermal flux processing system of claim 16, wherein the lift assembly comprises:

a plurality of lift pins disposed through the stage; and an actuator.

18. The thermal flux processing system of claim 14, further comprising:

a gas delivery system having a gas source fluidly coupled to the processing chamber; and an exhaust system fluidly coupled to the processing chamber.

19. A thermal flux processing device, comprising:

a continuous wave electromagnetic radiation source comprising a plurality of electromagnetic radiation sources, wherein at least one electromagnetic radiation source of the plurality of electromagnetic radiation sources emits electromagnetic radiation at a wavelength different from a second electromagnetic radiation source of the plurality of electromagnetic radiation sources;

a stage positioned to receive a substrate thereon; and a translation mechanism positioned to translate the continuous wave electromagnetic radiation source relative to the stage.

20. The thermal flux processing device of claim 19, wherein the plurality of electromagnetic radiation sources comprises at least one of an optical radiation source, an electron beam source, a microwave energy source, and a laser diode.

* * * * *